US011100857B2

(12) United States Patent
Tsujikawa

(10) Patent No.: US 11,100,857 B2
(45) Date of Patent: Aug. 24, 2021

(54) DISPLAY DEVICE AND ELECTRONIC APPARATUS

(71) Applicant: Sony Corporation, Tokyo (JP)

(72) Inventor: Shimpei Tsujikawa, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 16/094,308

(22) PCT Filed: Feb. 14, 2017

(86) PCT No.: PCT/JP2017/005225
§ 371 (c)(1),
(2) Date: Oct. 17, 2018

(87) PCT Pub. No.: WO2017/187720
PCT Pub. Date: Nov. 2, 2017

(65) Prior Publication Data
US 2019/0139489 A1 May 9, 2019

(30) Foreign Application Priority Data

Apr. 28, 2016 (JP) .............................. JP2016-090511

(51) Int. Cl.
*H01L 29/423* (2006.01)
*G09G 3/3233* (2016.01)
(Continued)

(52) U.S. Cl.
CPC ............. *G09G 3/3233* (2013.01); *G09F 9/30* (2013.01); *H01L 21/8234* (2013.01);
(Continued)

(58) Field of Classification Search
CPC ........... H01L 29/78696; H01L 29/4236; H01L 29/0638
See application file for complete search history.

(56) References Cited

U.S. PATENT DOCUMENTS 4,660,062 A * 4/1987 Nishizawa .......... H01L 29/4236
257/345
2005/0052365 A1* 3/2005 Jang ..................... G09G 3/3233
345/76
(Continued)

FOREIGN PATENT DOCUMENTS

CN 1586094 A 2/2005
CN 101192615 A 6/2008
(Continued)

OTHER PUBLICATIONS

Chinese Office Action dated May 27, 2020 for corresponding Chinese Application No. 201780024725.6.
(Continued)

*Primary Examiner* — Cuong Q Nguyen
*Assistant Examiner* — Peter M Albrecht
(74) *Attorney, Agent, or Firm* — Michael Best & Friedrich LLP

(57) ABSTRACT

[Object] To provide a display device that displays a display image with high resolution and higher uniformity, and an electronic apparatus including the display device.
[Solution] A display device including: a driving transistor including a first-conductivity-type activation region provided in a semiconductor substrate, an opening provided to cross the activation region, a gate insulating film provided on the activation region including an inside of the opening, a gate electrode filling the opening, and second-conductivity-type diffusion regions provided on both sides of the activation region across the opening; and an organic electroluminescent element configured to be driven by the driving transistor.

18 Claims, 10 Drawing Sheets

(51) Int. Cl.
  *H01L 21/8234* (2006.01)
  *H01L 27/088* (2006.01)
  *H05B 33/02* (2006.01)
  *H01L 27/092* (2006.01)
  *H01L 21/8238* (2006.01)
  *H01L 51/50* (2006.01)
  *G09F 9/30* (2006.01)
  *H01L 29/78* (2006.01)
  *H01L 27/32* (2006.01)
  *H01L 51/52* (2006.01)

(52) U.S. Cl.
  CPC ........ *H01L 21/8238* (2013.01); *H01L 27/088* (2013.01); *H01L 27/092* (2013.01); *H01L 27/3246* (2013.01); *H01L 27/3276* (2013.01); *H01L 29/78* (2013.01); *H01L 51/50* (2013.01); *H01L 51/5218* (2013.01); *H01L 51/5221* (2013.01); *H01L 51/5253* (2013.01); *H05B 33/02* (2013.01)

(56) References Cited

U.S. PATENT DOCUMENTS

| | | | | |
|---|---|---|---|---|
| 2006/0091482 A1* | 5/2006 | Kim | ................ | H01L 29/66621 257/401 |
| 2006/0234451 A1* | 10/2006 | Slesazeck | ......... | H01L 21/28114 438/259 |
| 2007/0029619 A1* | 2/2007 | Kim | ................ | H01L 21/28114 257/368 |
| 2009/0152625 A1 | 6/2009 | Lee et al. | | |
| 2013/0050067 A1* | 2/2013 | Yamashita | ........... | G09G 3/3233 345/76 |
| 2016/0322370 A1* | 11/2016 | Lee | ................ | H01L 27/11529 |

FOREIGN PATENT DOCUMENTS

| | | |
|---|---|---|
| CN | 102738145 A | 10/2012 |
| CN | 103872132 A | 6/2014 |
| CN | 104937720 A | 9/2015 |
| CN | 105355564 A | 2/2016 |
| CN | 105428405 A | 3/2016 |
| CN | 105470296 A | 4/2016 |
| JP | 2012-104519 A | 5/2012 |
| JP | 2012-255874 A | 12/2012 |
| JP | 2014-096568 A | 5/2014 |
| JP | 2014-098779 A | 5/2014 |
| JP | 2015-055763 A | 3/2015 |
| JP | 2016-053635 A | 4/2016 |

OTHER PUBLICATIONS

Japanese Office Action dated Jan. 5, 2021 for corresponding Japanese Application No. 2018-514136.

* cited by examiner

DISPLAY DEVICE AND ELECTRONIC APPARATUS

TECHNICAL FIELD

The present disclosure relates to a display device and an electronic apparatus.

BACKGROUND ART

In recent years, with an improvement in resolution of display devices, display elements constituting pixels of a display device and driving transistors that drive the display elements have become increasingly finer.

Here, threshold voltage variation of a field-effect transistor increases in inverse proportion to a reduction in channel width and channel length. Therefore, with an improvement in resolution of display devices, characteristic variation of a driving transistor increases, and uniformity of a display image decreases.

For example, Patent Literature 1 below discloses a technology of driving a display element using a driving transistor whose threshold voltage is controllable, in order to suppress display unevenness of a display image due to characteristic variation of a transistor.

In addition, as display elements constituting pixels of a display device have become finer, an amount of current needed to drive a display element has decreased. Therefore, by reducing a gate voltage of a driving transistor, on-current of the driving transistor is reduced to achieve an amount of current suitable for driving a display element.

CITATION LIST

Patent Literature

Patent Literature 1: JP 2012-255874A

DISCLOSURE OF INVENTION

Technical Problem

However, in the case where the gate voltage is reduced, the driving transistor is controlled with a gate voltage close to a threshold voltage. In such a case, variation in a threshold voltage that exists for each driving transistor has a larger influence on on-current; thus, on-current variation between driving transistors increases, and uniformity of a display image decreases.

Therefore, a decrease in uniformity of a display image caused by display elements and driving transistors becoming finer has been required to be improved.

Hence, the present disclosure proposes a novel and improved display device capable of displaying a display image with high resolution and higher uniformity, and an electronic apparatus including the display device.

Solution to Problem

According to the present disclosure, there is provided a display device including: a driving transistor including a first-conductivity-type activation region provided in a semiconductor substrate, an opening provided to cross the activation region, a gate insulating film provided on the activation region including an inside of the opening, a gate electrode filling the opening, and second-conductivity-type diffusion regions provided on both sides of the activation region across the opening; and an organic electroluminescent element configured to be driven by the driving transistor.

In addition, according to the present disclosure, there is provided an electronic apparatus including a display unit including a driving transistor including a first-conductivity-type activation region provided in a semiconductor substrate, an opening provided to cross the activation region, a gate insulating film provided on the activation region including an inside of the opening, a gate electrode filling the opening, and second-conductivity-type diffusion regions provided on both sides of the activation region across the opening, and an organic electroluminescent element configured to be driven by the driving transistor.

According to the present disclosure, a channel length can be made longer without an increase in an area occupied by a driving transistor; thus, the absolute value of on-current can be reduced. Therefore, threshold voltage variation between driving transistors can have a smaller influence on on-current, which can improve uniformity of a display image.

Advantageous Effects of Invention

According to the present disclosure as described above, a display device that displays a display image with high resolution and higher uniformity, and an electronic apparatus including the display device can be provided.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
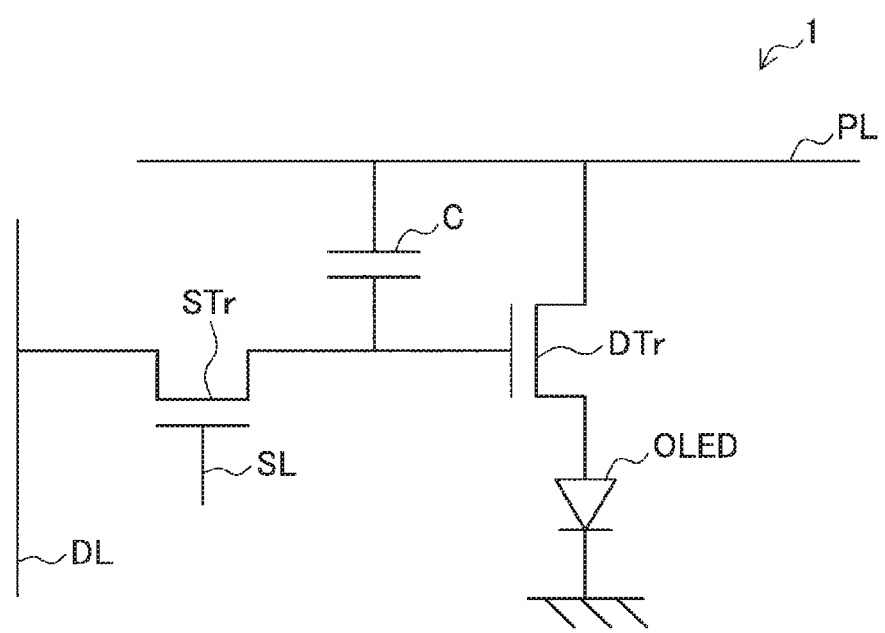
FIG. 1 is a circuit diagram for describing a circuit constituting one pixel of a display device to which the technology according to the present disclosure is applied.

Hereinafter, (a) preferred embodiments(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be given in the following order.
1. First Embodiment
1.1. Schematic Configuration of Display Device
1.2. Configuration of Transistor
2. Second Embodiment
2.1. Configuration of Transistor
2.2. Method for Producing Transistor
2.3. Effect of Transistor
3. Conclusion

1. First Embodiment

1.1. Schematic Configuration of Display Device

First, a schematic configuration of a display device to which a technology according to the present disclosure is applied is described with reference to FIGS. 1 and 2. FIG. 1 is a circuit diagram for describing a circuit constituting one pixel of a display device 1 to which the technology according to the present disclosure is applied.

As illustrated in FIG. 1, the circuit constituting one pixel of the display device 1 includes an organic electroluminescent element OLED, a driving transistor DTr, a capacitance element C, and a selection transistor STr.

The organic electroluminescent element OLED is, for example, a self-luminous light-emitting element in which an anode electrode, an organic light-emitting layer, and a cathode electrode are stacked. The anode electrode of the organic electroluminescent element OLED is connected to a power supply line PL via the driving transistor DTr, and the cathode electrode of the organic electroluminescent element OLED is connected to a ground line having a ground potential. That is, the organic electroluminescent element OLED functions as one pixel of the display device 1.

Specifically, one pixel including the organic electroluminescent element OLED functions as, for example, a subpixel that emits light of a single color, such as red, green, or blue. In addition, one display pixel is constituted by a pixel that emits red light, a pixel that emits green light, and a pixel that emits blue light, and multiple display pixels are arranged in a matrix; thus, a display panel capable of displaying an image corresponding to input signals is configured.

The driving transistor DTr is, for example, a field-effect transistor. One of a source and a drain of the driving transistor DTr is connected to the power supply line PL, and the other of the source and the drain is connected to the anode electrode of the organic electroluminescent element OLED. In addition, a gate of the driving transistor DTr is connected to one of a source and a drain of the selection transistor STr. The driving transistor DTr is connected in series to the organic electroluminescent element OLED, and controls current that flows in the organic electroluminescent element OLED in accordance with a magnitude of a gate voltage applied from the selection transistor STr, thereby driving the organic electroluminescent element OLED.

The selection transistor STr is, for example, a field-effect transistor. The one of the source and the drain of the selection transistor STr is connected to the gate of the driving transistor DTr, and the other of the source and the drain is connected to a signal line DL. In addition, a gate of the selection transistor STr is connected to a scan line SL. The selection transistor STr samples a voltage of the signal line DL, and then applies the voltage to the gate of the driving transistor DTr, thereby controlling a signal voltage that is applied to the gate of the driving transistor DTr.

The capacitance element C is, for example, a capacitor. One end of the capacitance element C is connected to the gate of the driving transistor DTr, and the other end of the capacitance element C is connected to the power supply line PL. The capacitance element C keeps a voltage between the gate and the source of the driving transistor DTr at a predetermined voltage.

Now, a stacked structure of one pixel of the display device 1 to which the technology according to the present disclosure is applied will be described with reference to FIG. 2. FIG. 2 is a cross-sectional view of one pixel of the display device 1 to which the technology according to the present disclosure is applied, taken along a thickness direction.

Figure 2:
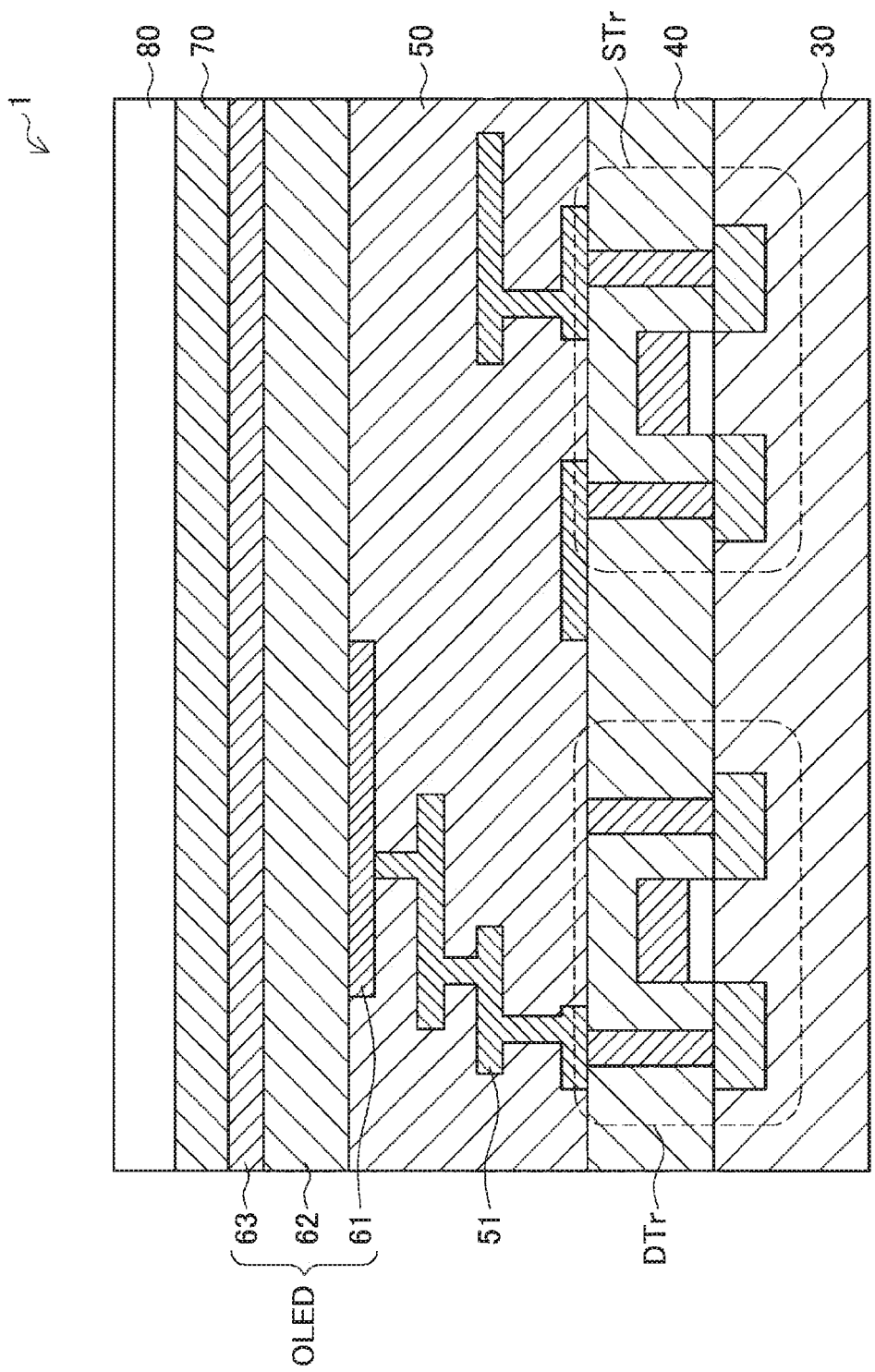
FIG. 2 is a cross-sectional view of one pixel of a display device to which the technology according to the present disclosure is applied, taken along a thickness direction.

As illustrated in FIG. 2, one pixel of the display device 1 includes a semiconductor substrate 30, the selection transistor STr, the driving transistor DTr, an insulating layer 40, a multilayer wiring layer 50 including wiring 51, an anode electrode 61, an organic light-emitting layer 62, a cathode electrode 63, a protective layer 70, and a color filter 80.

The semiconductor substrate 30 may be, for example, a single-crystalline, polycrystalline, or amorphous silicon (Si) substrate. A substrate including a semiconductor such as silicon facilitates fine patterning; thus, a fine driving transistor DTr and a fine selection transistor STr can be formed more easily.

The driving transistor DTr and the selection transistor STr are provided on the semiconductor substrate 30. The driving transistor DTr and the selection transistor STr each may be, for example, a metal-oxide-semiconductor field-effect transistor (MOSFET) including a channel region and source/drain regions provided in the semiconductor substrate 30, and a gate electrode provided on the channel region with a gate insulating film therebetween.

The insulating layer 40 is provided on the semiconductor substrate 30, and embeds the driving transistor DTr, the selection transistor STr, and the like. The insulating layer 40 includes, for example, silicon oxynitride or the like having an insulation property, and electrically insulates the embedded driving transistor DTr, selection transistor STr, and the like from each other.

The multilayer wiring layer 50 is provided on the insulating layer 40, and electrically connects the driving transistor DTr in the insulating layer 40 to the anode electrode 61 of the organic electroluminescent element OLED. The multilayer wiring layer 50 includes, in the layer, the wiring 51 including copper (Cu) or aluminum (Al), and includes silicon oxynitride or the like having an insulation property. Note that the wiring 51 routed in a plurality of layers inside the multilayer wiring layer 50 electrically connects various elements provided on the semiconductor substrate 30 to each other.

The anode electrode 61, the organic light-emitting layer 62, and the cathode electrode 63 are provided to be sequentially stacked on the multilayer wiring layer 50, and form the organic electroluminescent element OLED.

The anode electrode 61 includes, for example, a metal such as aluminum (Al), an aluminum alloy, platinum (Pt), gold (Au), chromium (Cr), or tungsten (W), and functions as a light reflection electrode.

The organic light-emitting layer 62 mainly includes an evaporative organic material, and emits light by an electric field being applied between the anode electrode 61 and the cathode electrode 63. Specifically, in the organic light-emitting layer 62, holes are injected from the anode electrode 61 and electrons are injected from the cathode electrode 63 by application of an electric field. The injected holes and electrons recombine in the organic light-emitting layer 62 to form excitons, and energy of the excitons can cause fluorescence or phosphorescence to be generated from a light-emitting material in the organic light-emitting layer 62.

The cathode electrode 63 includes, for example, indium zinc oxide, magnesium (Mg), silver (Ag), or an alloy of these, and functions as a transmission electrode. In addition, the cathode electrode 63 may include a multilayer film, for example, a multilayer film of a first layer including calcium (Ca), barium (Ba), lithium (Li), cesium (Cs), indium (In), magnesium (Mg), or silver (Ag) and a second layer including magnesium (Mg), silver (Ag), or an alloy of these.

The protective layer 70 is provided on the cathode electrode 63, protects the organic electroluminescent element OLED from external environment, and particularly prevents entry of moisture and oxygen to the organic light-emitting layer 62. The protective layer 70 may include, for example, a material with a high light-transmitting property and low permeability, such as silicon oxide ($SiO_x$), silicon nitride ($SiN_x$), aluminum oxide ($AlO_x$), or titanium oxide ($TiO_x$).

The color filter 80 is provided on the protective layer 70, and divides light generated in the organic electroluminescent element OLED into colors for each pixel. For example, the color filter 80 may be a resin layer that selectively transmits light of a visible light wavelength band corresponding to red light, green light, or blue light.

The display device 1 described with reference to FIGS. 1 and 2 has been increasingly improved in resolution, and for example, a display device in which a pixel pitch is 10 μm or less and resolution exceeds 2500 pixels per inch (ppi) has been developed.

Assuming that light emission efficiency of the organic electroluminescent element OLED is 0.5 cd/A and maximum luminance of one pixel is 1000 nit ($cd/m^2$), density of current that does in one pixel of the display device 1 having such high resolution is 2000 $A/m^2$. Therefore, assuming that one pixel includes organic electroluminescent elements OLED of subpixels of three colors, red, green, and blue (R, G, and B) and a pixel pitch is 10 μm, a maximum value of current that flows in one organic electroluminescent element OLED is 2000 $A/m^2 \times (10\ \mu m \times 10\ \mu m \div 3) \approx 67$ nA.

On the other hand, assuming that the driving transistor DTr is a MOSFET provided on a silicon substrate and a gate insulating film has a film thickness of 20 nm, gate capacitance $C_{ox}$ per unit area is 0.173 $\mu F/cm^2$, and channel mobility $\mu_{eff}$ is 60 $cm^2/V\cdot s$. Here, when saturated on-current $I_{on}$ is estimated by so-called gradual channel approximation assuming that a channel length L and a channel width W are both 1 μm, a threshold voltage $V_{th}$, is 1 V, and a gate voltage $V_g$ of 10 V is used, $I_{on}$ can be estimated to be about $4.2 \times 10^{-4}$ A from the following equation 1.

[Math. 1]

$$I_{on} = \mu_{eff} \times W \div L \times C_{ox} \times (V_g - V_{th})^2 \div 2 \qquad \text{equation 1}$$

Therefore, as calculated above, in the display device 1 increasingly improved in resolution, saturated on-current of the driving transistor DTr takes a value an order of magnitude higher than a maximum value of current that flows in the organic electroluminescent element OLED.

Therefore, in the case of controlling an order of on-current of the driving transistor DTr with a gate voltage to match the order with an order of current that flows in the organic electroluminescent element OLED, the driving transistor DTr is controlled with a gate voltage that makes $V_g - V_{th}$ be 100 mV or less. In such a case, even if $V_g$ is made constant, variation in threshold voltage $V_{th}$ between driving transistors DTr causes a value of $V_g - V_{th}$ to greatly fluctuate. Therefore, variation in amount of current flow between organic electroluminescent elements OLED increases, which makes luminance ununiform between pixels of a display image.

Here, to reduce on-current of the driving transistor DTr by a means other than a gate voltage, for example, it is possible to make a channel length of the driving transistor DTr longer. However, making the channel length longer increases an area occupied by the driving transistor DTr, increasing an area occupied by one pixel, which leads to a decrease in resolution of the display device 1.

In addition, it is possible to reduce on-current of the driving transistor DTr by using a semiconductor material having lower channel mobility than silicon; however, this is difficult to employ, because a semiconductor material appropriate in terms of channel mobility and ease of fine patterning has not been found besides silicon.

By making extensive studies on the above circumstances, the inventors of the technology according to the present disclosure have arrived at the technology according to the present disclosure. In the technology according to the present disclosure, an opening crossing an activation region provided in a semiconductor substrate is provided, and a channel is three-dimensionally formed inside the semiconductor substrate, which makes it possible to make an effective channel length longer without increasing an area occupied by a driving transistor. The technology according to the present disclosure can be used more suitably particularly in the case of driving an organic electroluminescent element made finer to have a smaller amount of current flow, by using a driving transistor provided on a semiconductor substrate of silicon or the like having high carrier mobility.

The technology according to the present disclosure, whose main points are described above, is described below in more detail.

1.2. Configuration of Transistor

Figure 3:
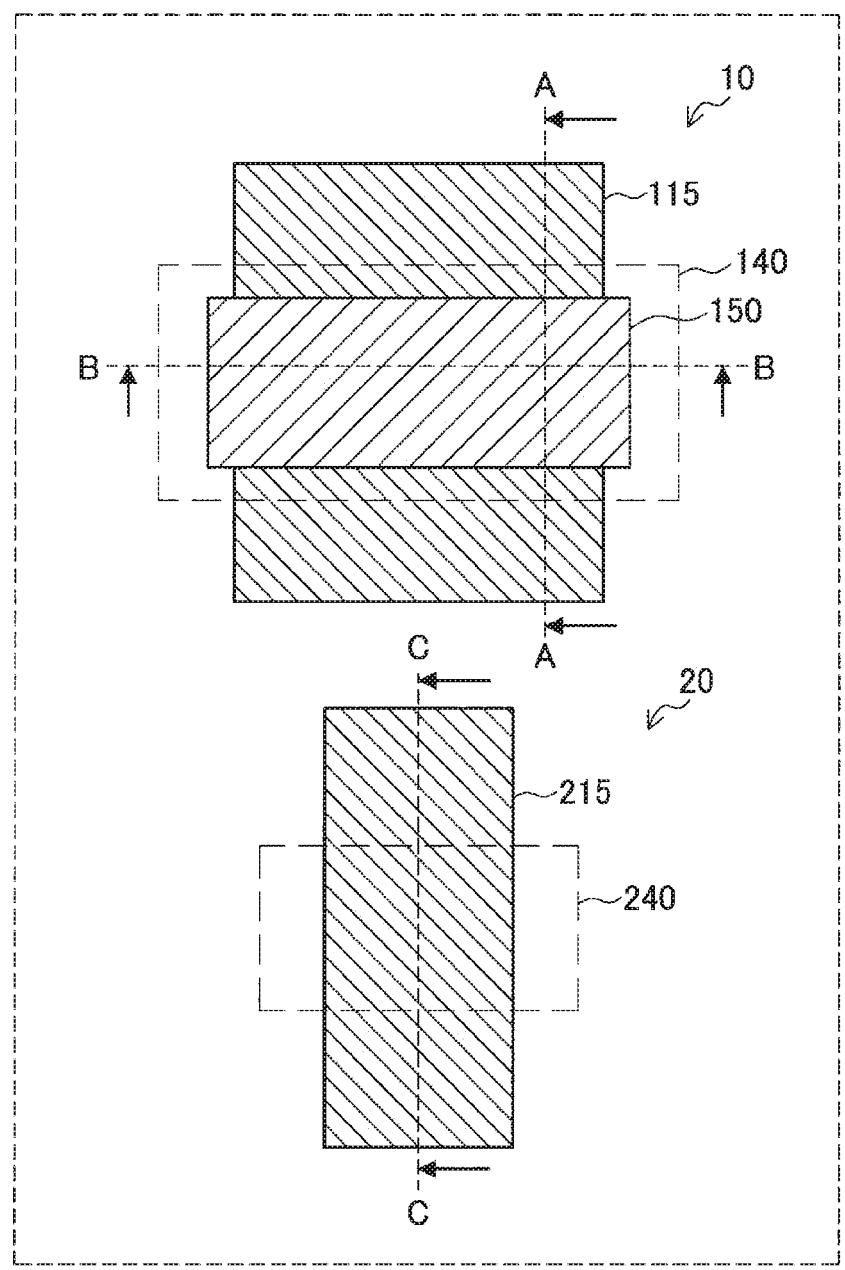
FIG. 3 is an explanatory diagram for describing planar structures of a driving transistor and a selection transistor used in a display device according to a first embodiment of the present disclosure.
Figure 4:
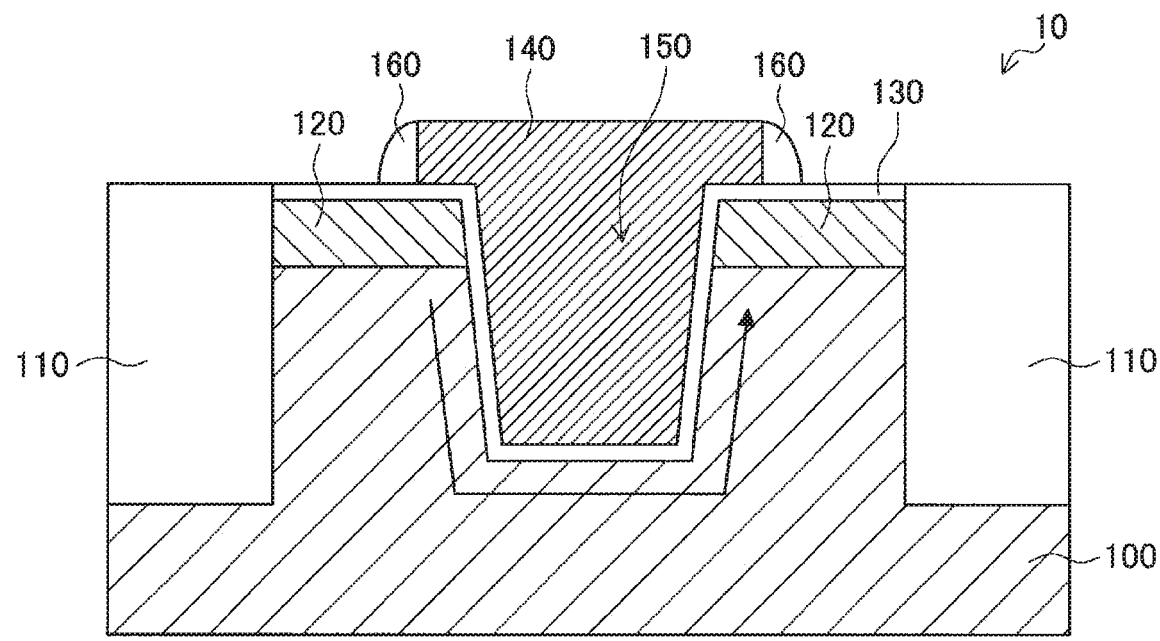
FIG. 4 is a cross-sectional view taken along section line A in FIG. 3.
Figure 5:
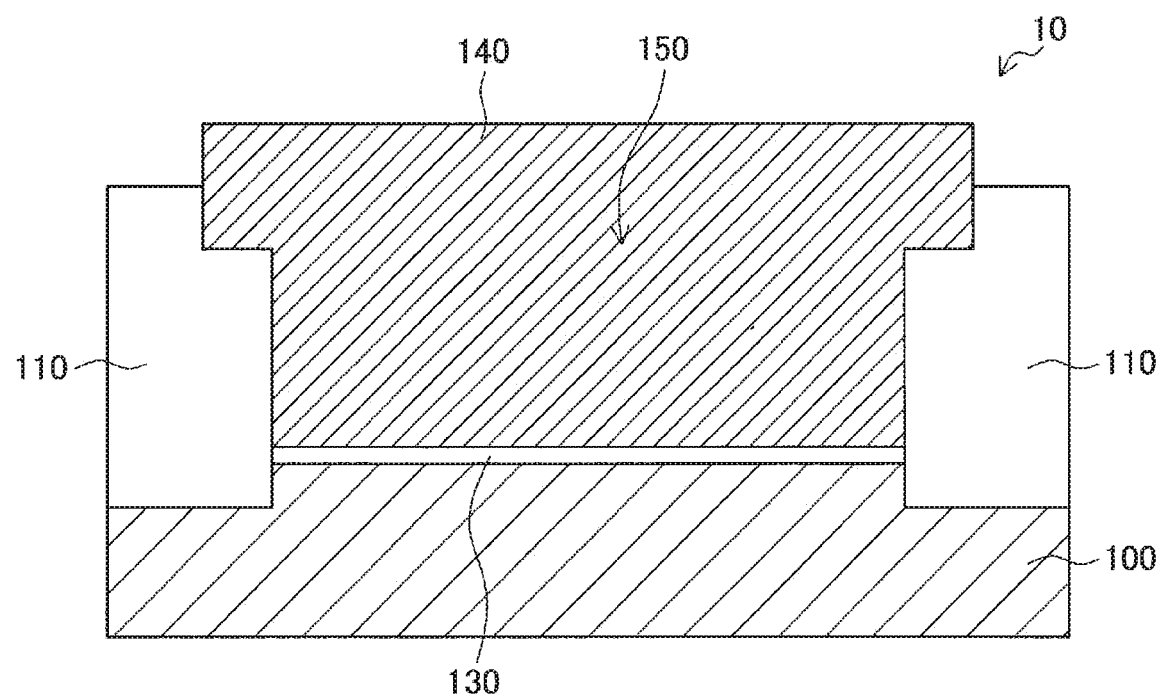
FIG. 5 is a cross-sectional view taken along section line B in FIG. 3.
Figure 6:
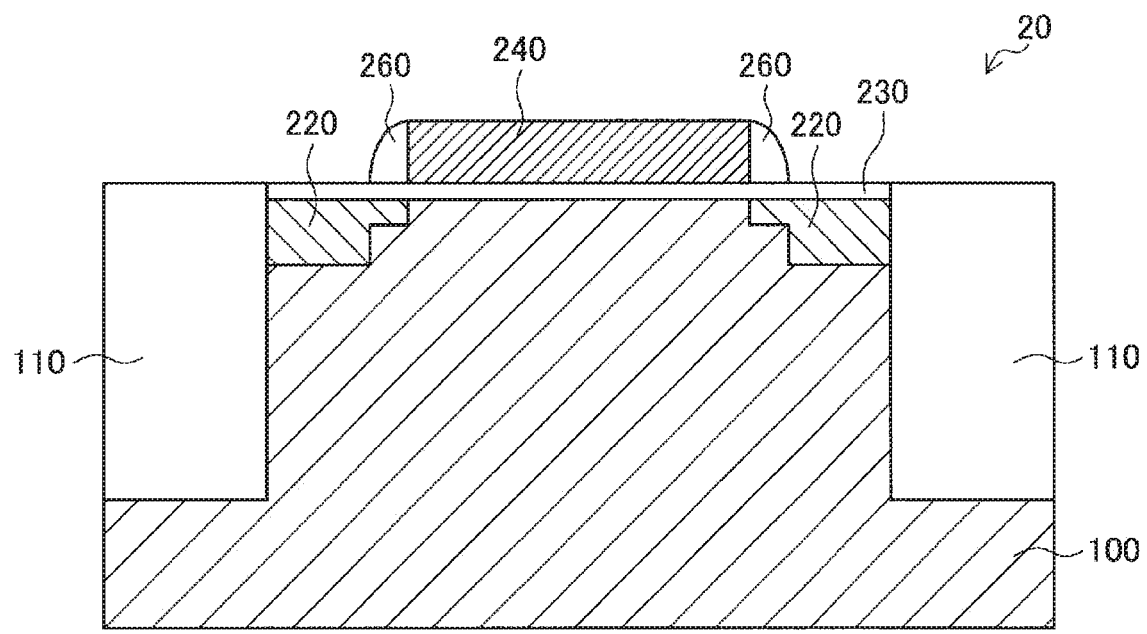
FIG. 6 is a cross-sectional view taken along section line C in FIG. 3.

Now, a configuration of a transistor used in a display device according to a first embodiment of the present disclosure will be described with reference to FIGS. 3 to 6. FIG. 3 is an explanatory diagram for describing planar structures of a driving transistor 10 and a selection transistor 20 used in the display device according to the present embodiment. In addition, FIG. 4 is a cross-sectional view taken along section line A in FIG. 3. FIG. 5 is a cross-sectional view taken along section line B in FIG. 3, and FIG. 6 is a cross-sectional view taken along section line C in FIG. 3.

Note that in the following description, "first-conductivity-type" expresses one of "p-type" and "n-type", and "second-conductivity-type" expresses the other of "p-type" and "n-type" that is different from "first-conductivity-type".

As illustrated in FIG. 3, the display device according to the present embodiment includes the driving transistor 10 that drives a light-emitting element such as an organic electroluminescent element, and the selection transistor 20 that controls a signal voltage that is applied to a gate electrode of the driving transistor 10.

The driving transistor 10 is, for example, a p-channel or n-channel MOSFET, and is provided on a first-conductivity-type activation region 115 of a semiconductor substrate 100. Specifically, a gate electrode 140 is provided on the activation region 115 with a gate insulating film therebetween, and second-conductivity-type source/drain regions are provided on both sides of the activation region 115 across the gate electrode 140; thus, the driving transistor 10 is configured.

Like the driving transistor 10, the selection transistor 20 is a p-channel or n-channel MOSFET, and is provided on a first-conductivity-type activation region 215 of the semiconductor substrate 100. Specifically, a gate electrode 240 is provided on the activation region 215 with a gate insulating film therebetween, and second-conductivity-type source/drain regions are provided on both sides of the activation region 215 across the gate electrode 240; thus, the selection transistor 20 is configured.

Note that an element isolation layer having an insulation property is provided in the semiconductor substrate 100 around the activation regions 115 and 215. The element isolation layer electrically insulates the driving transistor 10 and the selection transistor 20 from each other. Note that the driving transistor 10 and the selection transistor 20 may be MOSFETs of the same conductivity-type channel, or may be MOSFETs of different conductivity-type channels.

In the driving transistor 10 according to the present embodiment, an opening 150 crossing the activation region 115 is provided in the semiconductor substrate 100 under the gate electrode 140. In addition, the opening 150 provided in the semiconductor substrate 100 is filled with the gate insulating film and the gate electrode 140. Thus, in the driving transistor 10, a channel is three-dimensionally formed inside the semiconductor substrate 100 along the opening 150, which can make an effective channel length of the driving transistor 10 longer while the occupied area is the same. On the other hand, in the selection transistor 20, an opening or the like is not provided in the semiconductor substrate 100 under the gate electrode 240. That is, the selection transistor 20 may be provided as a MOSFET of a common structure.

Configuration of Driving Transistor

Specifically, as illustrated in FIGS. 4 and 5, the driving transistor 10 includes the semiconductor substrate 100, the opening 150 provided in the semiconductor substrate 100, a gate insulating film 130 provided on the activation region 115 including the inside of the opening 150, the gate electrode 140 filling the opening 150, source/drain regions 120 provided on both sides of the activation region 115 across the opening 150, and sidewall insulating films 160 provided on side surfaces of the gate electrode 140. In addition, an element isolation layer 110 is provided around the activation region 115 where the driving transistor 10 is provided.

The semiconductor substrate 100 is a substrate including any of various semiconductors, such as a group IV semiconductor, a group II-VI semiconductor, and a group III-V semiconductor. The semiconductor substrate 100 may be, for example, a substrate including single-crystalline, polycrystalline, or amorphous silicon (Si). In the case where the semiconductor substrate 100 is a substrate including single-crystalline, polycrystalline, or amorphous silicon (Si), a finer driving transistor 10 can be easily formed. In addition, the semiconductor substrate 100 is doped with a first-conductivity-type impurity (e.g., a p-type impurity such as boron (B)); thus, the activation region 115 is provided.

The element isolation layer 110 is a layer including an insulating material, and is provided in the semiconductor substrate 100 around the activation region 115. The element isolation layer 110 electrically insulates the activation region 115 from other activation regions, thereby electrically insulating the driving transistor 10 from other elements.

For example, the element isolation layer 110 may include an insulating oxide, such as silicon oxide ($SiO_x$). Specifically, the element isolation layer 110 may be formed by removing part of the semiconductor substrate 100 in a desired region by etching or the like, and then filling an opening formed by the etching with silicon oxide ($SiO_x$), by using a shallow trench isolation (STI) method. The element isolation layer 110 may be provided up to, for example, a depth of equal to or greater than 0.35 μm and equal to or less than 2 μm.

The opening 150 is provided in the semiconductor substrate 100 to cross the activation region 115. The opening 150 may be provided up to, for example, a depth of equal to or greater than 0.3 μm and equal to or less than 1.5 μm by dry etching, wet etching, or the like. In the case where the depth of the opening 150 is 0.3 μm or more, on-current variation can be suppressed significantly. In addition, in the case where the depth of the opening 150 is greater than 1.5 μm, while difficulty in forming the element isolation layer 110, which is formed deeper than the opening 150, increases, an amount of increase in an effect of suppressing on-current variation decreases, which is not preferable.

However, a depth of a region where the opening 150 is provided may be shallower than a depth at which the element isolation layer 110 is provided. This is because, in the case where the opening 150 is provided in a region deeper than the element isolation layer 110, a channel formed along the opening 150 is formed in a region deeper than the element isolation layer 110, which may cause leakage current between elements over the element isolation layer 110.

Note that the opening 150 may be provided to cross the activation region 115, up to part of the element isolation layer 110 in contact with the activation region 115. At this time, the opening 150 formed in the element isolation layer 110 is shallower in depth than the opening 150 formed in the activation region 115. This is a difference due to ease of processing by etching or the like between a semiconductor material constituting the activation region 115 and an insulating material constituting the element isolation layer 110.

The gate insulating film 130 is a thin film including an insulating material, and is provided on the activation region 115 including the inside of the opening 150. Specifically, the gate insulating film 130 is provided on the activation region 115 of the semiconductor substrate 100 along an uneven shape formed by the opening 150. The gate insulating film 130 may include, for example, an oxynitride having an insulation property, such as silicon oxide ($SiO_x$) or silicon nitride ($SiN_x$), or may include hafnium oxide ($HfO_x$) or the like, which is a high dielectric material. In addition, the gate insulating film 130 may be a film including a single layer of the above insulating material, or may be a film including a plurality of layers in which the above insulating materials are combined.

The gate electrode 140 is provided on the gate insulating film 130 so as to fill the opening 150. The gate electrode 140 may be provided so as to fill the opening 150 and, furthermore, protrude above a surface of the semiconductor substrate 100. For example, the gate electrode 140 may include polycrystalline silicon or the like, or may include a metal having a lower resistance value than polycrystalline silicon. In addition, the gate electrode 140 may include a stacked structure of a plurality of layers of a metal layer and a layer including polycrystalline silicon.

The sidewall insulating films 160 are sidewalls of insulating films provided on side surfaces of the gate electrode 140 protruding from the surface of the semiconductor substrate 100. Specifically, the sidewall insulating films 160 can be formed by forming an insulating film in a region including the gate electrode 140, and then performing etching with perpendicular anisotropy. For example, the sidewall insulating films 160 may include a single layer or a plurality of layers of an oxynitride having an insulation property, such as silicon oxide ($SiO_x$) or silicon nitride ($SiN_x$).

In the case where the sidewall insulating films 160 are formed in the driving transistor 10, the driving transistor 10 and the selection transistor 20 can be formed concurrently, which can improve efficiency of forming a pixel circuit of the display device 1. Note that the sidewall insulating films 160 can be omitted, because they do not particularly have an influence on the driving transistor 10.

The source/drain regions 120 are second-conductivity-type regions provided on both sides of the activation region 115 across the opening 150. The source/drain regions 120 are provided by, for example, doping a predetermined region of the activation region 115 with a second-conductivity-type impurity (e.g., an n-type impurity such as phosphorus (P) or arsenic (As)). Note that to the source/drain regions 120 are connected respective contact plugs that function as electrodes. Thus, the source/drain regions 120 each function as a source or a drain of the driving transistor 10.

In the driving transistor 10 having the structure described above, a channel is three-dimensionally formed via a region under the opening 150 between the source/drain regions 120; thus, a channel length can be made longer as compared with a case where the opening 150 is not provided.

Therefore, in the driving transistor 10, by making a channel length longer, an amount of saturated on-current can be reduced and made closer to an amount of current required in an organic electroluminescent element. Thus, on/off of the driving transistor 10 can be controlled with a gate voltage distanced from a threshold voltage, which can suppress on-current variation due to threshold voltage variation between the driving transistors 10. This makes it possible to suppress variation in amount of current that flows in an organic electroluminescent element between pixels, which can improve uniformity of a display image displayed in the display device.

(Configuration of Selection Transistor)

In addition, as illustrated in FIG. 6, the selection transistor 20 includes the semiconductor substrate 100, a gate insulating film 230 provided on the activation region 215, the gate electrode 240 provided on the gate insulating film 230, source/drain regions 220 provided on both sides of the activation region 215 across the gate electrode 240, and sidewall insulating films 260 provided on side surfaces of the gate electrode 240. In addition, the element isolation layer 110 is provided around the activation region 215 where the selection transistor 20 is provided.

The semiconductor substrate 100 and the element isolation layer 110 have been described in the configuration of the driving transistor 10; hence, description is omitted here.

The gate insulating film 230 is a thin film including an insulating material, and is provided on the activation region 215 of the semiconductor substrate 100. The gate insulating film 230 may include, for example, an oxynitride having an insulation property, such as silicon oxide ($SiO_x$) or silicon nitride ($SiN_x$), or may include hafnium oxide ($HfO_x$) or the like, which is a high dielectric constant material. In addition, the gate insulating film 230 may be a film including a single layer of the above insulating material, or may be a film including a plurality of layers in which the above insulating materials are combined.

The gate electrode 240 is provided on the gate insulating film 230. For example, the gate electrode 240 may include polycrystalline silicon or the like, or may include a metal having a lower resistance value than polycrystalline silicon. In addition, the gate electrode 240 may include a stacked structure of a plurality of layers of a metal layer and a layer including polycrystalline silicon.

The sidewall insulating films 260 are sidewalls of insulating films provided on side surfaces of the gate electrode 240. For example, the sidewall insulating films 260 may include a single layer or a plurality of layers of an oxynitride having an insulation property, such as silicon oxide ($SiO_x$) or silicon nitride ($SiN_x$).

The sidewall insulating films 260 function as partition walls that block an impurity from entering the semiconductor substrate 100 when the semiconductor substrate 100 is doped with the impurity. That is, in the source/drain regions 220 near the gate electrode 240, lightly-doped drain (LDD) regions doped to have the second conductivity type and having a lower concentration can be formed in a self-aligned manner, by performing doping with conditions changed between before and after formation of the sidewall insulating films 260.

The source/drain regions 220 are second-conductivity-type regions provided on both sides of the activation region 215 across the gate electrode 240. The source/drain regions 220 are provided by, for example, doping a predetermined region of the activation region 215 with a second-conductivity-type impurity (e.g., an n-type impurity such as phosphorus (P) or arsenic (As)). Note that to the source/drain regions 220 are connected respective contact plugs that function as electrodes. Thus, the source/drain regions 220 each function as a source or a drain of the selection transistor 20.

In addition, in the source/drain regions 220 near the gate electrode 240, second-conductivity-type LDD regions having a lower concentration than the source/drain regions 220 may be provided as described above. The LDD regions can relieve fluctuation of an electric field from the source/drain regions 220 to a channel, thereby suppressing generation of hot carriers.

That is, the selection transistor 20 is provided as a common field-effect transistor, without an opening being provided in the semiconductor substrate 100. In the case where on-current of the selection transistor 20 is reduced, signal strength to the driving transistor 10 decreases, so that on/off speed of the driving transistor 10 decreases. Therefore, unlike the driving transistor 10, the selection transistor 20 is provided as a field-effect transistor of a common structure.

2. Second Embodiment

2.1. Configuration of Transistor

Figure 7:
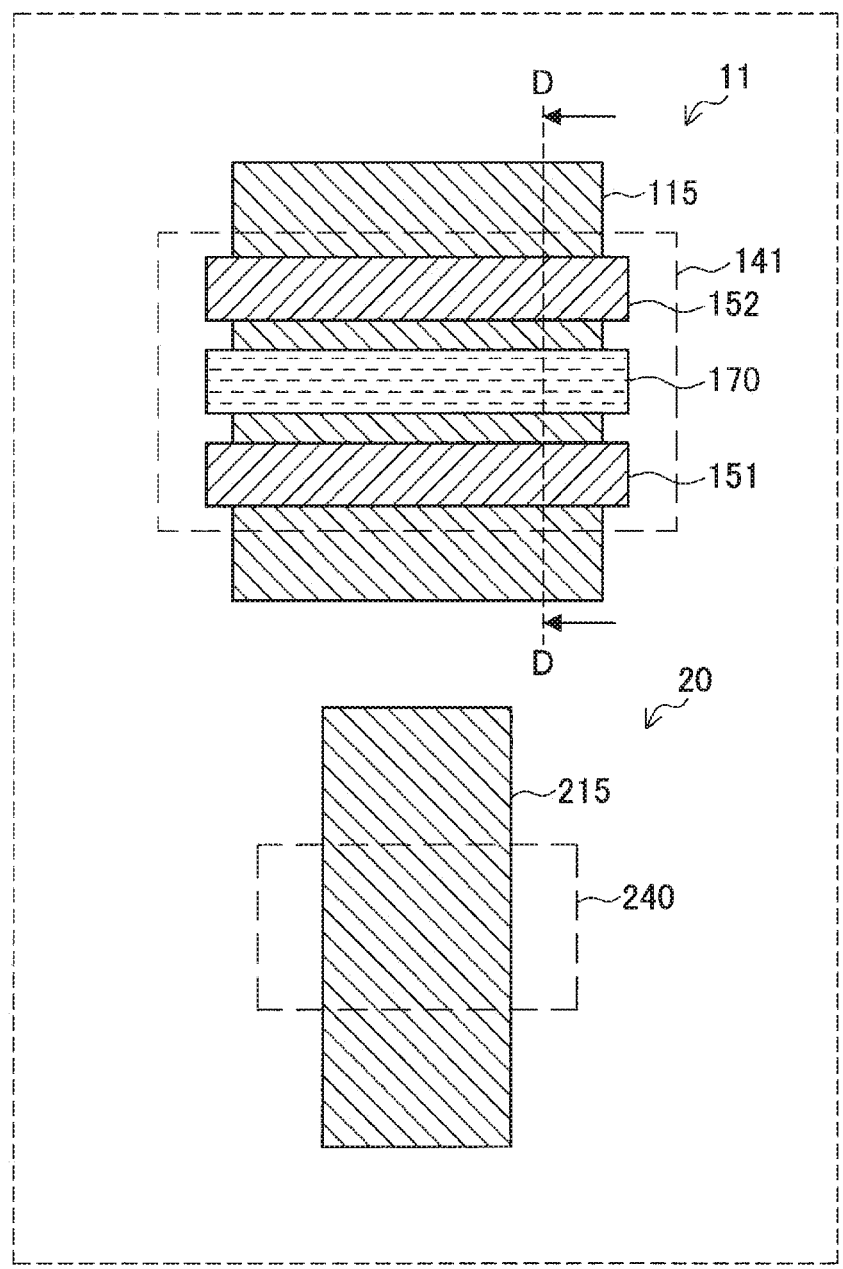
FIG. 7 is an explanatory diagram for describing planar structures of a driving transistor and a selection transistor used in a display device according to a second embodiment of the present disclosure.
Figure 8:
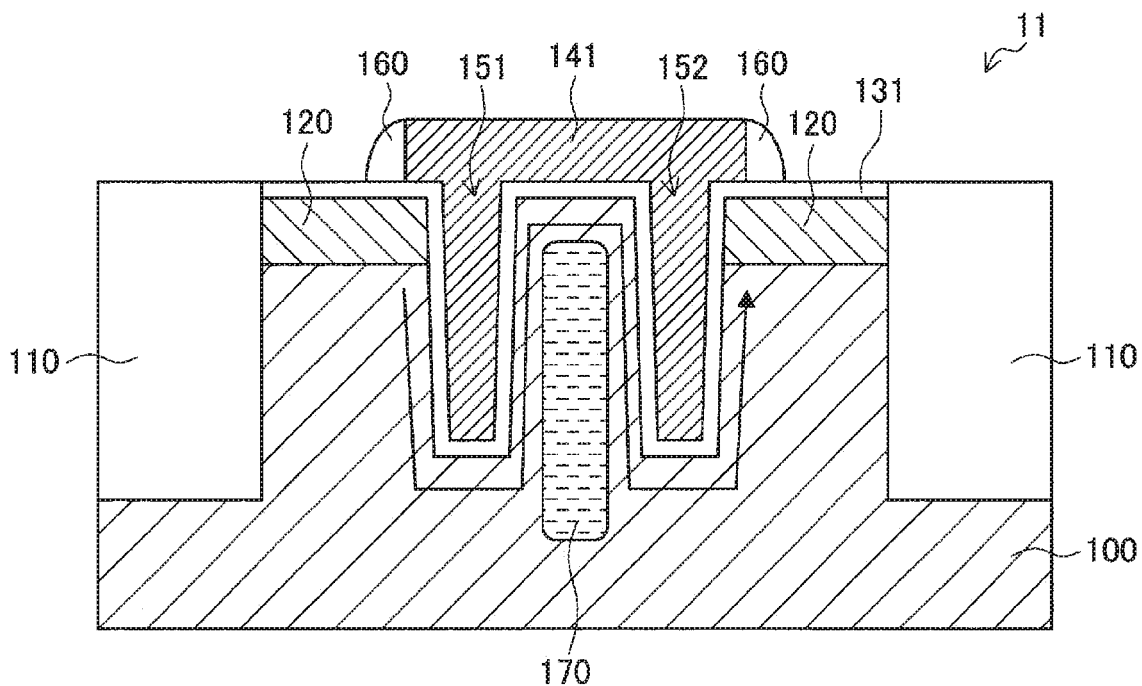
FIG. 8 is a cross-sectional view taken along section line D in FIG. 7.

Now, a configuration of a driving transistor used in a display device according to a second embodiment of the present disclosure will be described with reference to FIGS. 7 to 15. FIG. 7 is an explanatory diagram for describing planar structures of a driving transistor 11 and the selection transistor 20 used in the display device according to the present embodiment. FIG. 8 is a cross-sectional view taken along section line D in FIG. 7.

As illustrated in FIGS. 7 and 8, the display device according to the present embodiment includes the driving transistor 11 that drives a light-emitting element such as an organic electroluminescent element, and the selection transistor 20 that controls a signal voltage that is applied to a gate electrode of the driving transistor 11. Among these, the selection transistor 20 has a structure similar to that in the first embodiment; hence, description is omitted here.

In the driving transistor 11 according to the present embodiment, a plurality of openings 151 and 152 crossing the activation region 115 are provided in the semiconductor substrate 100 under the gate electrode 240. Thus, a channel of the driving transistor 11 is formed inside the semiconductor substrate 100 by passing under bottom surfaces of the openings 151 and 152. Therefore, in the driving transistor 11, an effective channel length of the driving transistor 11 can be made longer efficiently with the openings 151 and 152 having a smaller amount of opening than in the first embodiment; thus, the openings 151 and 152 can be formed more efficiently.

In addition, in the driving transistor 11 according to the present embodiment, a first-conductivity-type channel stopper region 170 crossing the activation region 115 and having a higher concentration than the activation region 115 may be provided inside the semiconductor substrate 100 between the plurality of openings 151 and 152.

Since a channel is not formed in the channel stopper region 170, providing the channel stopper region 170 makes it possible to form a channel of the driving transistor 11 in a zigzag shape along an uneven shape formed by the openings 151 and 152. Thus, an effective channel length of the driving transistor 11 can be made further longer with the same occupied area.

Specifically, as illustrated in FIG. 8, a structure of the driving transistor 11 according to the present embodiment includes the semiconductor substrate 100, the plurality of openings 151 and 152 provided in the semiconductor substrate 100, the channel stopper region 170 provided between the openings 151 and 152, a gate insulating film 131 provided on the activation region 115 including the inside of the openings 151 and 152, a gate electrode 141 filling the openings 151 and 152, the source/drain regions 120 provided on both sides of the activation region 115 across the openings 151 and 152, and the sidewall insulating films 160 provided on side surfaces of the gate electrode 141. In addition, the element isolation layer 110 is provided around the activation region 115 where the driving transistor 11 is provided.

The semiconductor substrate 100, the element isolation layer 110, the gate insulating film 131, the gate electrode 141, the sidewall insulating films 160, and the source/drain regions 120 are substantially similar to configurations of the same names described in the first embodiment; hence, description is omitted here.

The openings 151 and 152 are provided in the semiconductor substrate 100 to be arranged in series to cross the activation region 115. As described in the first embodiment, the openings 151 and 152 may be provided up to a depth of equal to or greater than 0.3 µm and equal to or less than 1.5 µm independently of each other by dry etching, wet etching, or the like. Furthermore, a depth of a region where the openings 151 and 152 are provided may be shallower than a depth at which the element isolation layer 110 is provided.

Note that FIG. 8 illustrates an example in which two openings (the openings 151 and 152) crossing the activation region 115 are provided in the semiconductor substrate 100, but the present embodiment is not limited to this example. Three or more openings crossing the activation region 115 may be provided in the semiconductor substrate 100 to be arranged in series. The number of openings provided in the semiconductor substrate 100 can be set as appropriate in a manner that a channel length of the driving transistor 11 is a desired length.

The channel stopper region 170 is a first-conductivity-type region provided to cross the activation region 115 and having a higher concentration than the activation region 115. The channel stopper region 170 is not provided on the surface of the semiconductor substrate 100, but is provided inside the semiconductor substrate 100 so as not to contact the openings 151 and 152. Thus, the channel stopper region 170 can secure a region where a zigzag-shaped channel can be formed, between the openings 151 and 152. The channel stopper region 170 can be provided by, for example, additionally doping the activation region 115 between the openings 151 and 152 with a first-conductivity-type impurity (e.g., a p-type impurity such as boron (B)).

In addition, a depth at which the channel stopper region 170 is provided may be deeper than a depth of a region where the openings 151 and 152 are provided, and may further be deeper than a depth at which the element isolation layer 110 is provided. Thus, the channel stopper region 170 can prevent a channel of the driving transistor 11 from being formed by passing further under the channel stopper region 170. Note that the channel stopper region 170 may be provided at, for example, a depth of 0.1 µm or more.

In the driving transistor 11 having the structure described above, a channel is three-dimensionally formed via a region under the openings 151 and 152 between the source/drain regions 120; thus, a channel length can be made further longer. In addition, in the case where the channel stopper region 170 is provided, in the driving transistor 11, the openings 151 and 152 and the channel stopper region 170 enable a channel to be formed in a zigzag shape inside the semiconductor substrate 100; thus, a channel length can be made further longer.

Therefore, in the driving transistor 11, saturated on-current can be further reduced, which makes it possible to control on/off of the driving transistor 11 with a gate voltage further distanced from a threshold voltage. This can further suppress on-current variation due to threshold voltage variation between the driving transistors 11, which can further improve uniformity of a display image displayed in the display device.

2.2. Method for Producing Transistor

Next, a method for producing the transistor according to the present embodiment is described with reference to FIGS.

9 to 14. FIGS. 9 to 14 are cross-sectional views each for describing a step of the method for producing the transistor according to the present embodiment.

Figure 9:
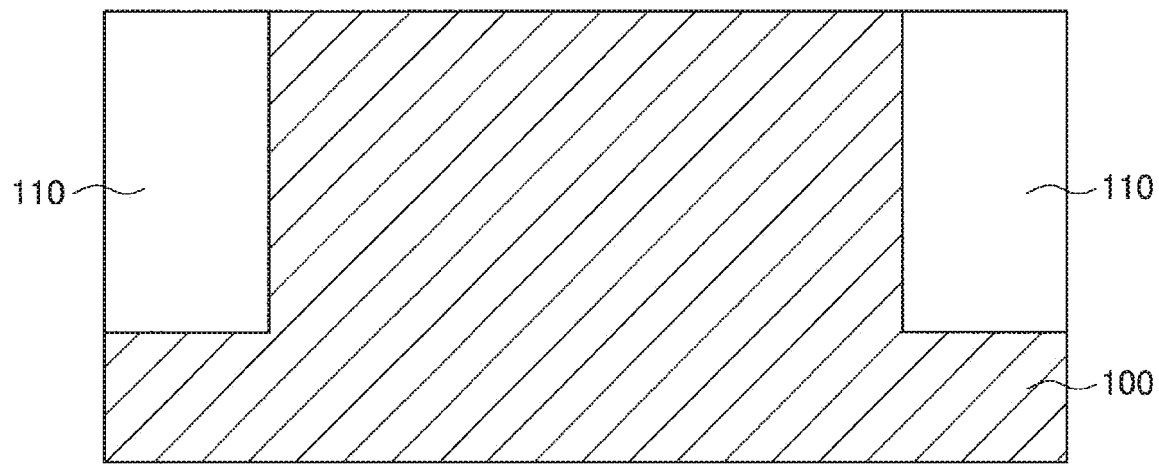
FIG. 9 is a cross-sectional view for describing a step of a method for producing a transistor according to the embodiment.

First, as illustrated in FIG. 9, the semiconductor substrate 100 including silicon (Si) is subjected to ion implantation (doping) of boron (B); thus, the activation regions 115 and 215 are formed. After that, according to a so-called STI method, etching is performed using a resist layer patterned so as to form the activation regions 115 and 215, and then a film of $SiO_2$ is formed; thus, the element isolation layer 110 is formed. Note that a depth at which the element isolation layer 110 is formed is set to 1.2 μm.

Then, a thermal oxide film of approximately several nanometers is formed on surfaces of the activation regions 115 and 215, and then ion implantation is performed in accordance with characteristics of the driving transistor 11 or the selection transistor 20. For example, to dope approximately 1 μm from the surface with boron (B) with a concentration of about $5 \times 10^{17}/cm^3$, ion implantation is performed a plurality of times with different energies on the activation region 115 of the driving transistor 11.

Figure 10:
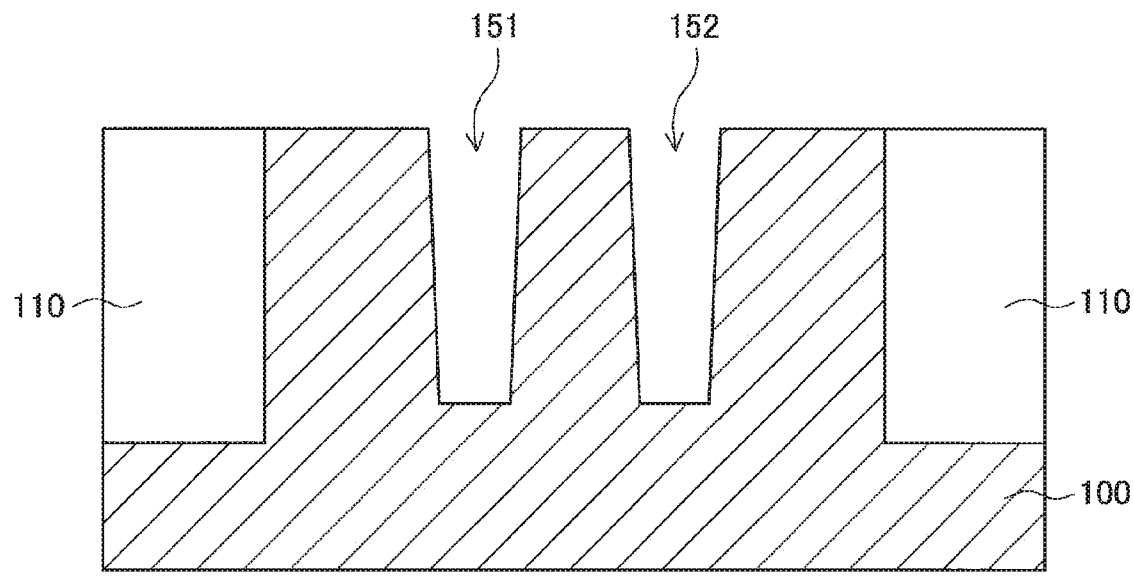
FIG. 10 is a cross-sectional view for describing a step of a method for producing a transistor according to the embodiment.

Next, as illustrated in FIG. 10, a patterned resist layer is formed, and then dry etching or the like is performed; thus, the openings 151 and 152 with depths of 1 μm crossing the activation region 115 are formed.

At this time, dry etching may be performed in a manner that the openings 151 and 152 are formed also in the element isolation layer 110 in contact with the activation region 115. Thus, the openings 151 and 152 reliably crossing the activation region 115 can be formed. Note that a difference in etching rate between Si and $SiO_2$ causes depths of the openings 151 and 152 formed in the element isolation layer 110 to be, for example, approximately 50 μm.

Figure 11:
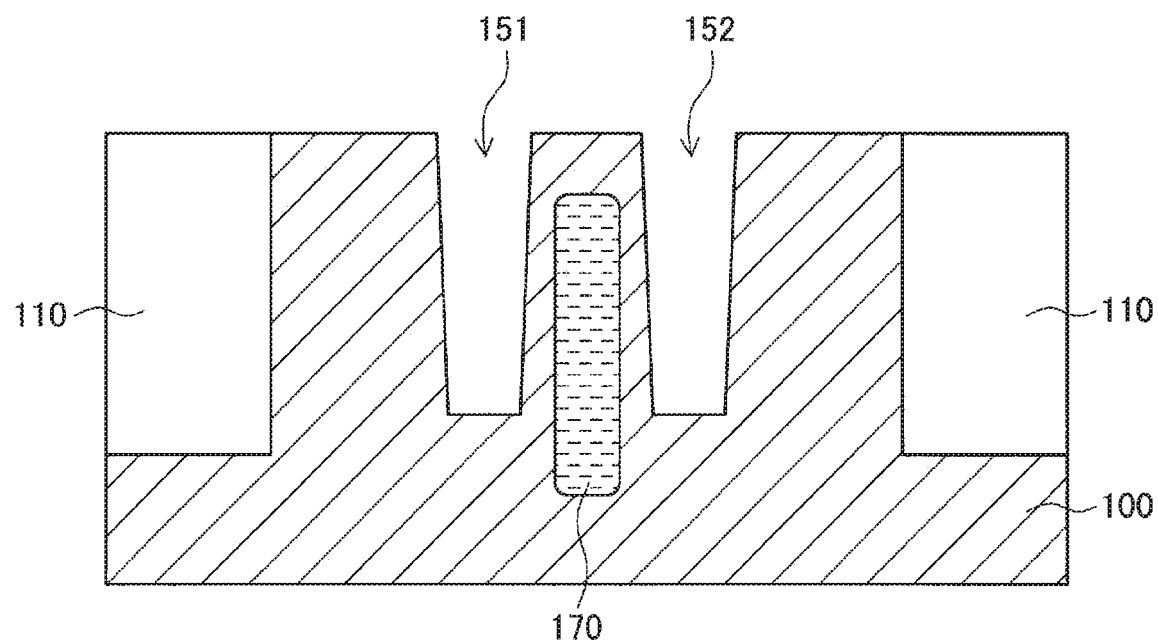
FIG. 11 is a cross-sectional view for describing a step of a method for producing a transistor according to the embodiment.

Then, as illustrated in FIG. 11, by using a resist or the like made open between the openings 151 and 152 by lithography as a mask, ion implantation of boron (B) is selectively performed on a space between the openings 151 and 152. Thus, the channel stopper region 170 doped with boron (B) with a concentration of about $4 \times 10^{18}/cm^3$ is formed. In addition, predetermined ion implantation is performed in order for the selection transistor 20 or the like other than the driving transistor 11 to have desired characteristics.

Figure 12:
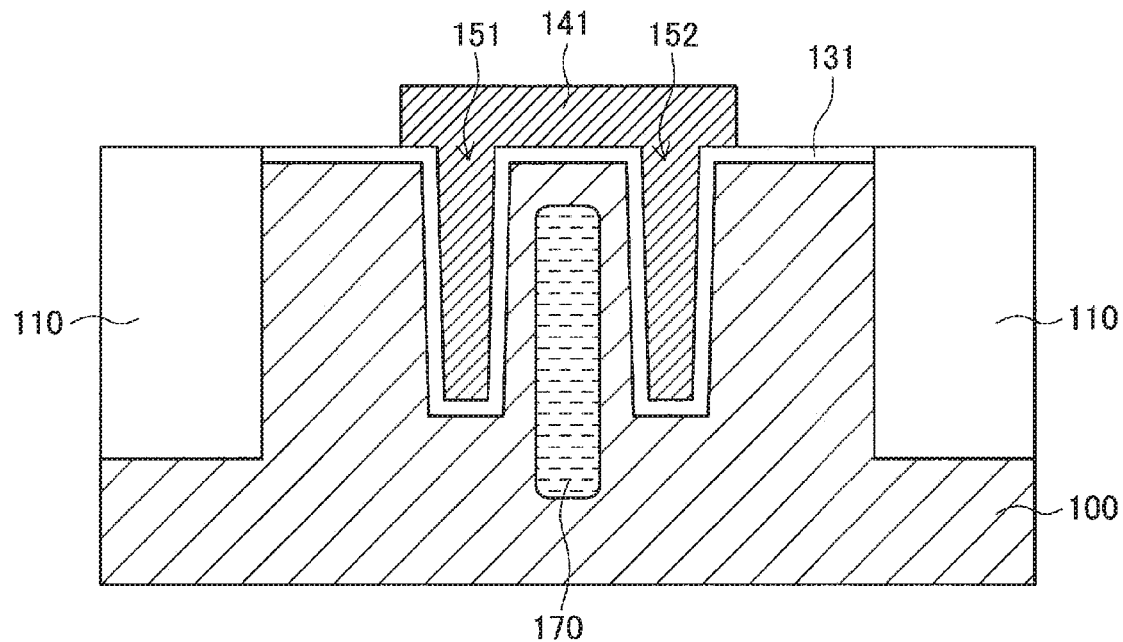
FIG. 12 is a cross-sectional view for describing a step of a method for producing a transistor according to the embodiment.

Next, as illustrated in FIG. 12, the gate insulating film 131 is formed. Specifically, by radical oxidation using oxygen radicals or thermal oxidation, a uniform $SiO_2$ film of 3 nm is formed on the surfaces of the activation regions 115 and 215 and inside the openings 151 and 152. Furthermore, the $SiO_2$ film is caused to grow approximately 15 nm by a chemical vapor deposition (CVD) method, and then a $Si_3N_4$ film of 3 nm is formed by a CVD method; thus, the gate insulating film 131 of 21 nm in total is formed.

Furthermore, the gate electrode 141 is formed on the gate insulating film 131. Specifically, a film of polycrystalline silicon including phosphorus (P) with a concentration of $3 \times 10^{20}/cm^3$ is formed with a thickness of 200 nm by a CVD method using $SiH_4$ and $PH_3$ as source gas. Thus, for example, the openings 151 and 152 with widths of approximately 15 μm can be completely filled. After that, by wet etching using a mixed aqueous solution of hydrofluoric acid and nitric acid, P-containing polycrystalline silicon other than the driving transistor 11 is selectively removed.

Then, a film of non-doped polycrystalline silicon is formed with a thickness of 200 nm as the gate electrode 240 of the selection transistor 20, and the film of non-doped polycrystalline silicon formed in the driving transistor 11 is removed by dry etching or the like.

Figure 13:
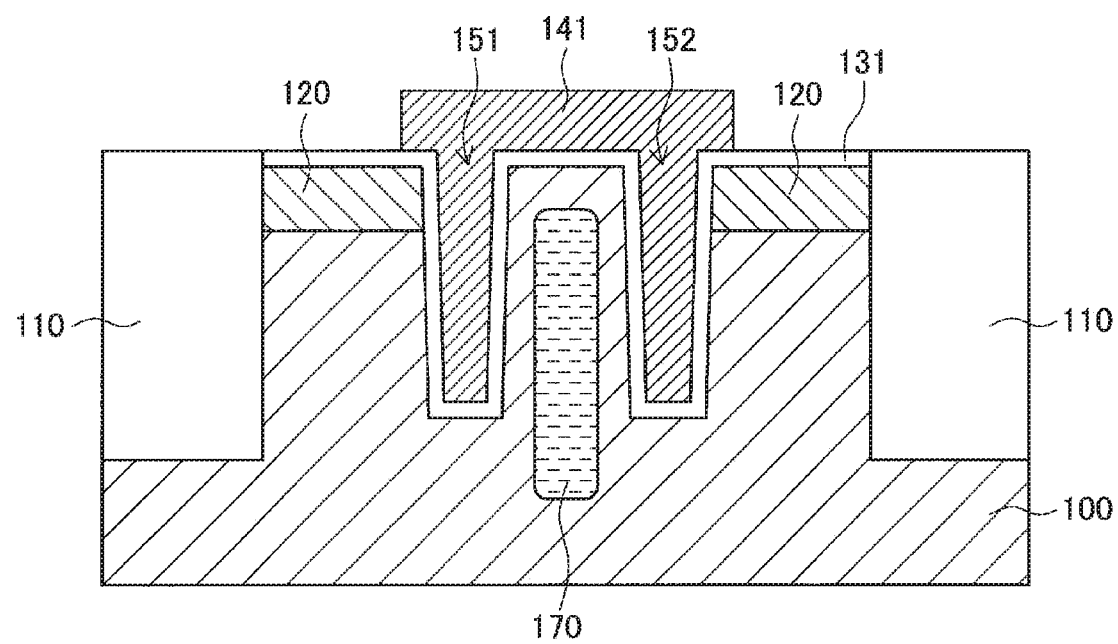
FIG. 13 is a cross-sectional view for describing a step of a method for producing a transistor according to the embodiment.

Next, as illustrated in FIG. 13, ion implantation of phosphorus (P) is performed by using a resist or the like of which a predetermined region is patterned by photolithography as a mask; thus, the source/drain regions 120 of the driving transistor 11 are formed.

Figure 14:
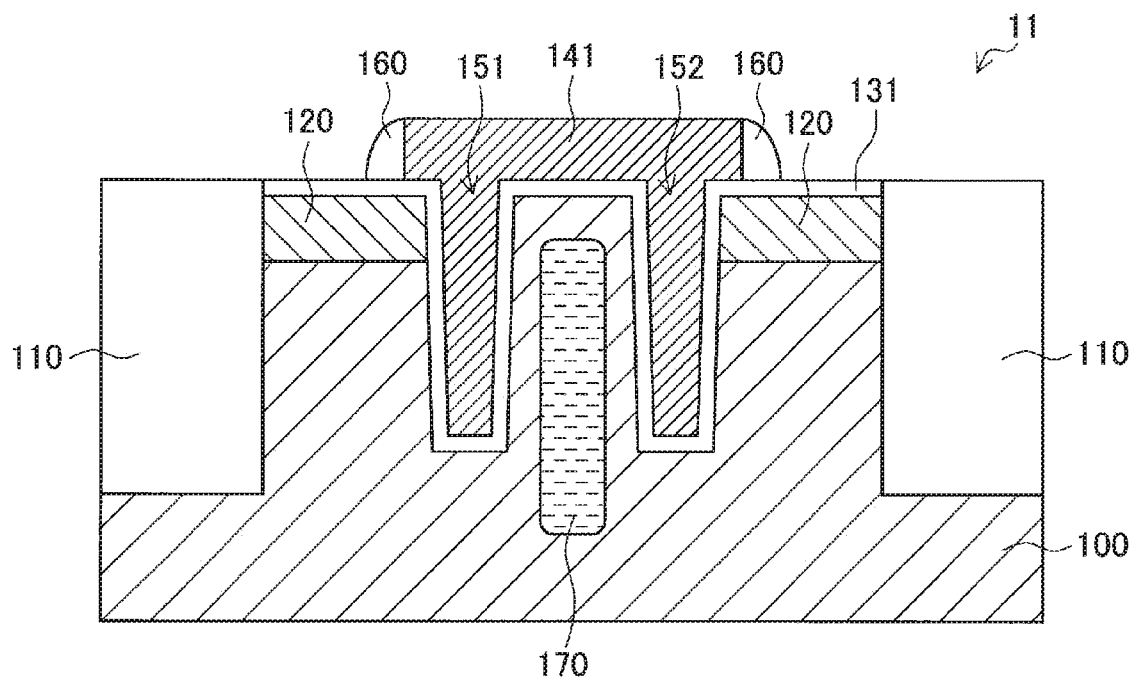
FIG. 14 is a cross-sectional view for describing a step of a method for producing a transistor according to the embodiment.

Then, as illustrated in FIG. 14, a film of $SiO_2$ of 100 nm is formed by a CVD method, and then etch back is performed; thus, the sidewall insulating films 160 and 260 are formed. In addition, ion implantation of phosphorus (P) is performed with different concentrations between before and after formation of the sidewall insulating films 160 and 260; thus, the source/drain regions 220 of the selection transistor 20 including LDD regions are formed.

Through the above steps, the driving transistor 11 according to the present embodiment can be produced. In addition, the display device according to the present embodiment can be produced by further forming the organic electroluminescent element OLED configured to be connected to the driving transistor 11 according to the present embodiment. Note that by referring to the method for producing the display device according to the second embodiment of the present disclosure, the display device according to the first embodiment of the present disclosure can be produced similarly.

Specifically, formation of silicide at contact points between the gate, the source, and the drain and respective plugs, formation of contact holes, and formation of contact plugs are performed on the driving transistor 11 illustrated in FIG. 14; thus, gate, source, and drain electrodes are formed. In addition, a multilayer wiring layer is formed and wiring from the electrodes is routed, and then the organic electroluminescent element OLED is formed and a protective layer or the like is further formed; thus, a display device can be produced. For these steps, methods similar to those for publicly known common steps can be used; hence, description is omitted here.

Through the above steps, the display device according to the second embodiment of the present disclosure can be produced. Note that by referring to the method for producing the display device according to the second embodiment of the present disclosure, the display device according to the first embodiment of the present disclosure can be produced similarly.

2.3. Effect of Transistor

Next, an effect provided by the driving transistor 11 used in the display device according to the present embodiment is described. First, the driving transistor 11 produced by the above production method was prepared.

Note that a gate length (a width of a gate electrode in a direction in which the source/drain regions 120 are provided) of the driving transistor 11 was set to 0.8 μm, widths of the openings 151 and 152 were set to 0.15 μm, and a width of a channel stopper region was set to 0.3 μm.

First, it was confirmed that saturated on-current of the driving transistor 11 produced by the above production method was reduced by the formation of the openings 151 and 152. Specifically, saturated on-current when 8 V was applied as a drain-source voltage $V_{ds}$ and a gate-source voltage $V_{gs}$ was measured.

In a driving transistor not provided with the openings 151 and 152, saturated on-current was 350 μA, whereas in the driving transistor 11 according to the present embodiment, saturated on-current was 54 μA. Therefore, it was confirmed that by providing the openings 151 and 152, an effective channel length is made longer, and saturated on-current can be reduced to ⅙ or less. This is a characteristic corresponding to about 5 µm in effective channel length.

Figure 15:
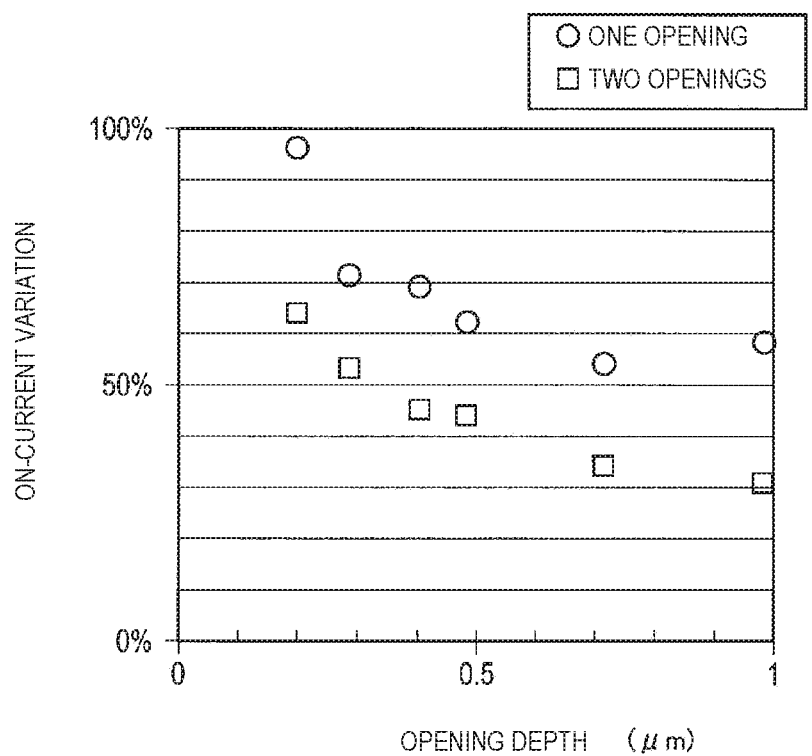
FIG. 15 is a graph showing the relationship of on-current variation with respect to the number and depth of openings provided in a driving transistor.

Then, the relationship between on-current variation of the driving transistor 11 produced by the above production method and the number and depth of openings was evaluated. Specifically, 4 V was applied as a drain-source voltage $V_{ds}$, then a gate-source voltage $V_{gs}$ that makes a median value of on-current be 0.01 µA was applied to the driving transistor, and on-current variation was evaluated. Results are shown in FIG. 15. FIG. 15 is a graph showing the relationship of on-current variation with respect to the number and depth of openings provided in the driving transistor 11.

Note that in FIG. 15, the degree of suppression of on-current variation depending on the number and depth of the openings 151 and 152 was evaluated by a proportion with respect to 100%, which is on-current variation of the driving transistor not provided with the openings 151 and 152.

As illustrated in FIG. 15, it was confirmed that on-current variation can be suppressed by increasing the depth of an opening. In particular, it was confirmed that on-current variation is significantly suppressed by setting the depth of an opening to 300 nm or more. It was also confirmed that on-current variation is further suppressed by increasing the number of openings. In particular, it was confirmed that in the case where two openings are provided and the depths of the openings are 300 nm or more, on-current variation can be suppressed to 50% or less, as compared with a case where no opening is provided.

Furthermore, it was confirmed that in such a case, on-current variation is suppressed, and luminance variation of an organic electroluminescent element between pixels of a display device is also suppressed, which improves uniformity of a display image to a viewable degree.

3. Conclusion

As described above, according to the present disclosure, in the driving transistor 10 that drives an organic electroluminescent element, which is one pixel of a display device, an effective channel length can be made longer without an increase in occupied area. Specifically, in the driving transistor 10, a channel length can be made longer by providing the opening 150 crossing the activation region 115 and three-dimensionally forming a channel inside the semiconductor substrate 100 along the opening 150.

Thus, on-current of the driving transistor 10 can be reduced without reducing a gate voltage that is applied, which can suppress on-current variation due to threshold voltage variation between the driving transistors 10. Therefore, on-current variation can be suppressed without an increase in an area occupied by the driving transistor 10; thus, in a display device, uniformity of a display image can be improved while resolution is increased.

Note that the display device described above can also be used as a display unit of various electronic apparatuses that display input image signals or image signals generated inside as a still image or a moving image. Examples of such electronic apparatuses include a music player including a storage medium such as a semiconductor memory, an imaging device such as a digital camera and a video camera, a notebook personal computer, a game console, a mobile information terminal such as a mobile phone and a smartphone, and the like.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A display device including:
a driving transistor including
a first-conductivity-type activation region provided in a semiconductor substrate,
an opening provided to cross the activation region,
a gate insulating film provided on the activation region including an inside of the opening,
a gate electrode filling the opening, and
second-conductivity-type diffusion regions provided on both sides of the activation region across the opening; and
an organic electroluminescent element configured to be driven by the driving transistor.

(2)

The display device according to (1), in which a plurality of the openings are provided to be arranged in series.

(3)

The display device according to (2), in which a first-conductivity-type channel stopper region having a higher concentration than the activation region is provided between the openings.

(4)

The display device according to (3), in which the channel stopper region is provided to cross the activation region.

(5)

The display device according to (3) or (4), in which the channel stopper region is provided inside the semiconductor substrate.

(6)

The display device according to any one of (3) to (5), in which the channel stopper region is provided up to a region deeper than an element isolation layer having an insulation property provided around the activation region.

(7)

The display device according to any one of (1) to (6), in which the opening has a depth of 300 nm or more.

(8)

The display device according to (7), in which the opening is provided in a region shallower than an element isolation layer having an insulation property provided around the activation region.

(9)

The display device according to any one of (1) to (8), in which the semiconductor substrate is a silicon substrate.

(10)

An electronic apparatus including
a display unit including
a driving transistor including
a first-conductivity-type activation region provided in a semiconductor substrate,
an opening provided to cross the activation region,
a gate insulating film provided on the activation region including an inside of the opening, a gate electrode filling the opening, and second-conductivity-type diffusion regions provided on both sides of the activation region across the opening, and an organic electroluminescent element configured to be driven by the driving transistor.

REFERENCE SIGNS LIST 1 display device
10, 11 driving transistor
20 selection transistor
100 semiconductor substrate
110 element isolation layer
115 activation region
120 source/drain region
130, 131 gate insulating film
140, 141 gate electrode
150, 151, 152 opening
160 sidewall insulating film
170 channel stopper region
OLED organic electroluminescent element
DTr driving transistor
STr selection transistor

The invention claimed is:

1. A display device comprising:
a driving transistor that comprises:
source/drain regions in an activation region of a semiconductor substrate,
an opening that extends into the semiconductor substrate from a surface of the semiconductor substrate,
a gate electrode that fills the opening, and
a gate insulating film that coats the opening so as to electrically insulate the gate electrode from the activation region;
a selection transistor that is configured to:
control a signal voltage that is applied to the gate electrode; and
an element isolation layer that:
extends into the semiconductor substrate from the surface of the semiconductor substrate to a depth that is deeper than the opening,
wherein, in a planar structural view of the display device:
a portion of the element isolation layer is between the selection transistor and the driving transistor.

2. The display device according to claim 1, wherein, in the planar structural view of the display device, the gate electrode is between one of the source/drain regions and another of the source/drain regions.

3. The display device according to claim 1, wherein, in the planar structural view of the display device, the opening crosses the activation region by extending along a section line from a segment of the element isolation layer to another segment of the element isolation layer.

4. The display device according to claim 1, wherein, in the planar structural view of the display device, the element isolation layer surrounds the activation region.

5. The display device according to claim 1, wherein the opening has a depth of 300 nm or more.

6. The display device according to claim 1, further comprising:
an organic electroluminescent element that is electrically connected to the driving transistor in a manner that permits the driving transistor to drive the organic electroluminescent element.

7. The display device according to claim 1, further comprising:
other activation regions of the semiconductor substrate, the element isolation layer electrically insulates the activation region from the other activation regions.

8. The display device according to claim 1, further comprising:
a channel stopper region of the semiconductor substrate, the channel stopper region is between a first one of the opening and a second one of the opening.

9. The display device according to claim 8, wherein the channel stopper region extends deeper into the semiconductor substrate than the opening.

10. The display device according to claim 8, wherein the channel stopper region crosses the activation region in the planar structural view of the display device.

11. The display device according to claim 8, further comprising:
diffusion regions of the semiconductor substrate, the first one of the opening is between the channel stopper region and a first one of the diffusion regions.

12. The display device according to claim 11, wherein the second one of the opening is between the channel stopper region and a second one of the diffusion regions.

13. The display device according to claim 11, wherein the activation region is of a first-conductivity-type, each of the diffusion regions are of a second-conductivity-type.

14. The display device according to claim 13, wherein the second-conductivity-type is opposite to the first-conductivity-type.

15. The display device according to claim 13, wherein the channel stopper region is of the first-conductivity-type.

16. The display device according to claim 15, wherein a concentration of an impurity of the first-conductivity-type in the channel stopper region is higher that a concentration of an impurity of the first-conductivity-type in of the activation region.

17. The display device according to claim 1, wherein the semiconductor substrate is a silicon substrate.

18. An electronic apparatus comprising:
the display device according to claim 1.

* * * * *